(12) United States Patent
Anderson, Jr. et al.

(10) Patent No.: US 6,388,524 B1
(45) Date of Patent: May 14, 2002

(54) HYSTERETIC CONTROL OF AUDIO GAIN IN RESPONSE TO BATTERY CONDITIONS

(75) Inventors: Wayne Anderson, Jr., Dacula; Marc B. Riley, Lawrenceville, both of GA (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/849,215

(22) Filed: May 4, 2001

(51) Int. Cl.$^7$ .................................................. H03G 3/10
(52) U.S. Cl. ...................................... 330/279; 330/285
(58) Field of Search ................................ 330/279, 285, 330/297

(56) References Cited

U.S. PATENT DOCUMENTS

| | | | | |
|---|---|---|---|---|
| 5,179,353 A | * | 1/1993 | Miyake | 330/129 |
| 5,208,549 A | * | 5/1993 | Andoh | 330/129 |
| 5,229,721 A | * | 7/1993 | Stade | 330/265 |
| 6,246,285 B1 | * | 6/2001 | Nishikido | 330/132 |
| 6,278,325 B1 | * | 8/2001 | Juang | 330/285 |
| 6,315,204 B1 | * | 11/2001 | Knighton et al. | 235/462.43 |

* cited by examiner

*Primary Examiner*—Robert Pascal
*Assistant Examiner*—Henry Choe
(74) *Attorney, Agent, or Firm*—Philip H. Burrus, IV; Bockhop & Reich, LLP

(57) ABSTRACT

An electronic accessory, powered by a battery having a first terminal and a second terminal includes a voltage comparator capable of comparing the battery voltage to at least one reference voltage and that generates a voltage comparator signal having a value that is a function of the battery voltage relative to the reference voltage. A gain control circuit couples an input signal to a first signal path when the voltage comparator signal is above a first value and to a second signal path when the voltage comparator signal is below a second value. The first signal path includes a first component that causes an amplifier to have a first gain. The second signal path includes a second component that causes the amplifier to have a second gain.

7 Claims, 2 Drawing Sheets

HYSTERETIC CONTROL OF AUDIO GAIN IN RESPONSE TO BATTERY CONDITIONS

BACKGROUND OF THE INVENTION

1. Field of the Invention

The present invention relates to electronic accessories and, more specifically, to accessaries for battery powered electronic devices.

2. Description of the Prior Art

Dumb accessories for cellular telephones typically attach to a telephone, take an audio signal from the telephone and use the signal to provide an added feature. For example, a clip-on speaker phone accessory uses an amplifier to transform a cellular telephone into a speaker phone. A dumb accessory does not receive feedback from the telephone and, therefore, it must be designed to handle the worst case characteristics of the telephone.

With a clip-on speaker phone, the gain and power available are limited by the minimum voltage specification of the battery voltage range in the telephone. Typically, total harmonic distortion (THD) of less than 5% is desirable in an audio speaker device. However, voltage in a lithium battery may vary (depending on the charge state of the battery) between 4.2V to 3V. To maintain THD at the desired level, most engineers choose a low amplifier gain for the speaker phone so as to avoid clipping when the battery discharges and as the battery voltage approaches 3V, rather than choosing a high amplifier gain that would permit maximum power output when the battery is fully charged. Thus, while the amplifier prevents clipping at low battery voltage, it is incapable of realizing maximum power output when the battery is fully charged.

Therefore, there is a need for a circuit that adjusts amplifier gain as a function of battery voltage in a dumb accessory.

DETAILED DESCRIPTION OF THE INVENTION

Figure 1:
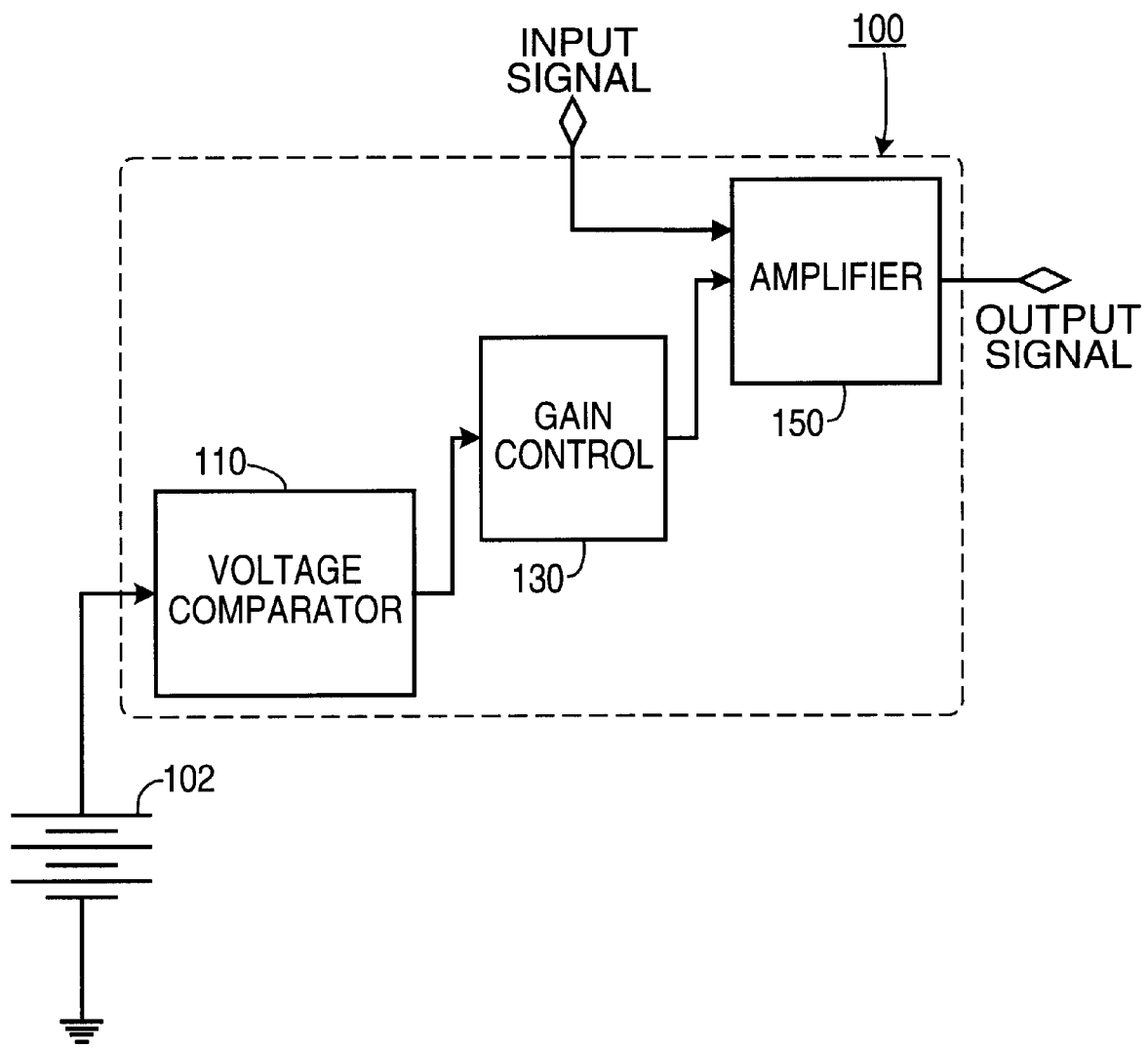
FIG. 1 is a conceptual block diagram of an exemplary embodiment of the invention.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

In one embodiment, the invention includes an electronic accessory, powered by a battery having a first terminal and a second terminal that includes a voltage comparator that is capable of comparing the battery voltage to at least one reference voltage and that generates a voltage comparator signal having a value that is a function of the battery voltage relative to the reference voltage. A gain control circuit couples an input signal to a first signal path when the voltage comparator signal is above a first value and couples the input signal to a second signal path when the voltage comparator signal is below a second value. An amplifier is responsive to both the first signal path and the second signal path. The first signal path includes a first component that causes the amplifier to have a first gain. The second signal path includes a second component that causes the amplifier to have a second gain, so that the amplifier has the first gain when the voltage comparator signal indicates that the battery voltage is above a first value and that has the second gain when the voltage comparator signal indicates that the battery voltage is below a second value.

In another embodiment, the invention includes a method of controlling an amplifier that is part of an electronic accessory that is driven by a battery having a battery voltage. The battery voltage is sensed and the amplifier is configured to have a first gain when the battery voltage is above a first threshold. The amplifier is also configured to have a second gain when the battery voltage is below a second threshold.

As shown in FIG. 1, the accessory 100 includes a voltage comparator 110, which compares the voltage of a battery 102 (which may be included in the accessory 100, but more typically is not included in the accessory) to a predetermined threshold. A gain control device 130, which is responsive to the voltage comparator 110 sets the gain of an amplifier 150 to a high value when the battery 102 voltage is above the threshold and sets the gain to a low value when the battery 102 voltage is below the threshold. Two thresholds may be employed to include hysteresis in the gain selection process. Such hysteresis would prevent flutter of the amplifier gain when the battery 102 voltage is at a marginal value.

Figure 2:
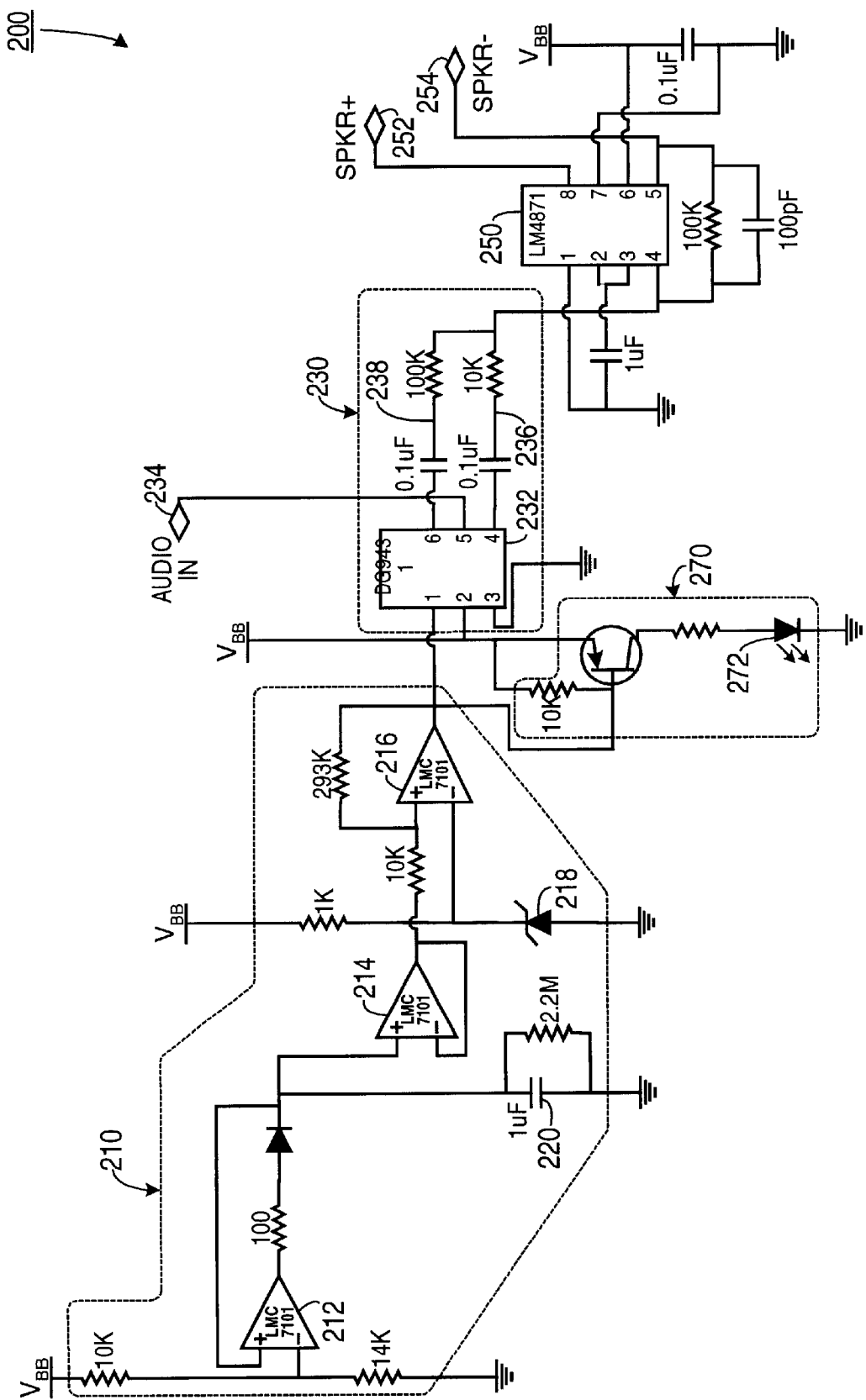
FIG. 2 is a schematic diagram of an exemplary embodiment of the invention.

One specific embodiment 200 of the invention is shown in FIG. 2, in which the voltage comparator 210 drives the gain control device 230 and an indicator 270 that indicates low battery voltage by way of a light emitting diode 272. The gain control device 230 feeds an input signal 234 into an amplifier 250, which drives a positive speaker terminal 252 and a negative speaker terminal 254.

The voltage comparator 210 includes a first operational amplifier 212 that is configured as a slow peak detector to monitor the battery voltage without passing along quick voltage transients, such as those caused by digital telephone transmissions (in the case where the invention is used as a speaker phone adapter for a cellular telephone). A second operational amplifier 216 is configured as a comparator with a trip point set by a Zener diode 218. Hysteresis is set by selection of the resistors used to configure operational amplifier 216. A third operational amplifier 214 is configured as a voltage follower so as to isolate operational amplifier 216 from operational amplifier 212. This ensures that feedback from operational amplifier 216 does not load any components that feed into operational amplifier 216 (such as capacitor 220) when operational amplifier 216 trips low.

The gain control device 230 includes an analog switch 232 that routes the input signal 234 to either a first signal path 236 or a second signal path 238, depending on the battery voltage. The first signal path 236 includes (in this specific example) a series 10 KΩ resistor, whereas the second signal path 238 includes a series 100 KΩ resistor. The first signal path 236 and the second signal path 238 are input to the amplifier 250. The amplifier 250 is biased so that if the analog switch 232 directs the input signal 234 through the first signal path 236, the amplifier 250 will have a relatively high gain (which would be equal to 10 when the resistor has a value 10 KΩ and so that if the analog switch 232 directs the input signal 234 through the second signal path 238, the amplifier 250 will have a relatively low gain (which would be equal to 1 when the resistor has a value 100 KΩ).

The path chosen by analog switch 232 is determined by input signal at pin 1 of analog switch 232. If pin 1 is low, gain path 236 is chosen and high gain results. Pin 1 low will occur when monitored battery voltage is above the upper trip point of the comparator 210. If pin 1 is high, gain path 238 is chosen and low gain results. Pin 1 high will occur when monitored battery voltage is lower that the lowest point of the comparator 210.

The above described embodiments are given as illustrative examples only. It will be readily appreciated that many deviations may be made from the specific embodiments disclosed in this specification without departing from the invention. Accordingly, the scope of the invention is to be determined by the claims below rather than being limited to the specifically described embodiments above.

What is claimed is:

1. An electronic accessory, powered by a battery having a first terminal and a second terminal, a battery voltage existing between the first terminal and the second terminal, the electronic accessory comprising:
   a. a voltage comparator, capable of comparing the battery voltage to at least one reference voltage, that generates a voltage comparator signal having a value that is a function of the battery voltage relative to the reference voltage; and
   b. an amplification circuit that has a first gain when the voltage comparator signal indicates that the battery voltage is above a first value and that has a second gain when the voltage comparator signal indicates that the battery voltage is below a second value.

2. The electronic accessory of claim 1, wherein the first value is greater than the second value.

3. The electronic accessory of claim 1, wherein the amplification circuit is capable of having a plurality of gains, each gain corresponding to a different battery voltage range.

4. The electronic accessory of claim 1, wherein the amplification circuit comprises:
   a. a gain control circuit that couples an input signal to a first signal path when the voltage comparator signal is above the first value and that couples the input signal to a second signal path when the voltage comparator signal is below the second value; and
   b. an amplifier, responsive to both the first signal path and to the second signal path, wherein the first signal path includes a first component that causes the amplifier to have the first gain and wherein the second signal path includes a second component that causes the amplifier to have the second gain.

5. The electronic accessory of claim 4, wherein the first gain is greater than the second gain.

6. The electronic accessory of claim 4, further comprising an indicator that indicates when the voltage comparator signal is below the second value.

7. An electronic accessory, powered by a battery having a first terminal and a second terminal, a battery voltage existing between the first terminal and the second terminal, the electronic accessory comprising:
   a. a voltage comparator, capable of comparing the battery voltage to at least one reference voltage, that generates a voltage comparator signal having a value that is a function of the battery voltage relative to the reference voltage;
   b. a gain control circuit that couples an input signal to a first signal path when the voltage comparator signal is above a first value and that couples the input signal to a second signal path when the voltage comparator signal is below a second value; and
   c. an amplifier, responsive to both the first signal path and to the second signal path, wherein the first signal path includes a first component that causes the amplifier to have a first gain and wherein the second signal path includes a second component that causes the amplifier to have a second gain, different from the first gain, so that the amplifier has the first gain when the voltage comparator signal indicates that the battery voltage is above the first value and that has the second gain when the voltage comparator signal indicates that the battery voltage is below the second value, less than the first value, the first gain being greater than the second gain.

* * * * *